United States Patent
Madsen et al.

(10) Patent No.: US 6,850,416 B2
(45) Date of Patent: Feb. 1, 2005

(54) COMMUNICATION PANEL

(75) Inventors: Dale C. Madsen, Jordan, MN (US); David J. Johnsen, New Hope, MN (US)

(73) Assignee: ADC Telecommunications, Inc., Eden Prairie, MN (US)

(*) Notice: Subject to any disclaimer, the term of this patent is extended or adjusted under 35 U.S.C. 154(b) by 528 days.

(21) Appl. No.: 09/871,580

(22) Filed: May 31, 2001

(65) Prior Publication Data

US 2002/0179422 A1 Dec. 5, 2002

(51) Int. Cl.$^7$ .............................. H05K 5/00; H05K 5/04; H05K 5/06
(52) U.S. Cl. ...................... 361/752; 361/753; 361/796; 361/803; 361/814
(58) Field of Search ................................ 361/752, 753, 361/796, 788, 803, 814, 816, 818, 800; 174/35 R; 439/61–62, 65, 74

(56) References Cited

U.S. PATENT DOCUMENTS

| | | | | |
|---|---|---|---|---|
| 4,621,373 A | * | 11/1986 | Hodsdon | 455/90.3 |
| 5,121,296 A | * | 6/1992 | Hsu | 361/685 |
| 5,960,942 A | * | 10/1999 | Thornton | 200/314 |
| 6,207,912 B1 | * | 3/2001 | Persson | 200/305 |
| 6,229,709 B1 | * | 5/2001 | Hardt et al. | 361/753 |
| 6,261,104 B1 | * | 7/2001 | Leman | 439/61 |
| 6,339,536 B1 | * | 1/2002 | Buican et al. | 361/818 |
| 6,674,650 B1 | * | 1/2004 | Davis et al. | 361/796 |
| 2002/0056300 A1 | * | 5/2002 | Pierre et al. | 70/303 A |

OTHER PUBLICATIONS

*Next Generation Frames—Accessories*; ADC Telecommunications, 10/98, p. 19.
*Fiber Distribution Frame—Accessories*; ADCTelecommunications, 6/98, p. 111.
*Auxiliary Equipment—Communication Panels*, ADCTelecommunications, 5/98, p. 57.
*DSX–I, DSX–IC High Density Bays (Prewired)*; ADCTelecommunications, 5/98, p. 24.
*PEM Self–Clinching Nuts—Bulletin CLI200* (12 pages).
David J. Johnsen, entitled Communications Panel, filed May 31, 2001, U.S. patent application Ser. No. 29/142,744, Design patent.
David J. Johnson, entitled Communications Panel, filed May 31, 2001, U.S. patent application Ser. No. 29,142,735, Design patent.

* cited by examiner

Primary Examiner—Amir Zarabian
Assistant Examiner—Thanh Y. Tran
(74) Attorney, Agent, or Firm—Merchant & Gould P.C.

(57) ABSTRACT

Embodiments of a communication panel are disclosed that include structures that facilitate maintaining and assembling the communication panel, protect the keypad buttons, and/or protect the integrated circuits of the communication panel. Embodiments include structures such as perpendicular circuit board configurations, multi-sided removable cover surfaces, and multi-layered front panels with keypad holes. Elastomeric keypads may be included and buttons of the keypad protrude through holes in the multi-layered front panels.

29 Claims, 18 Drawing Sheets

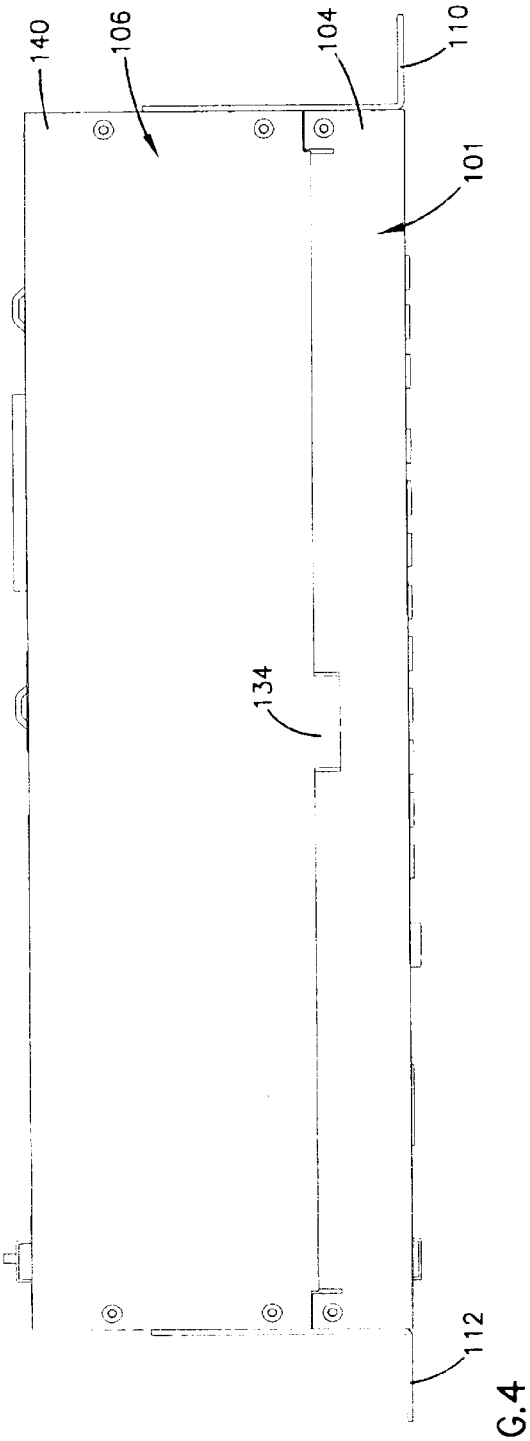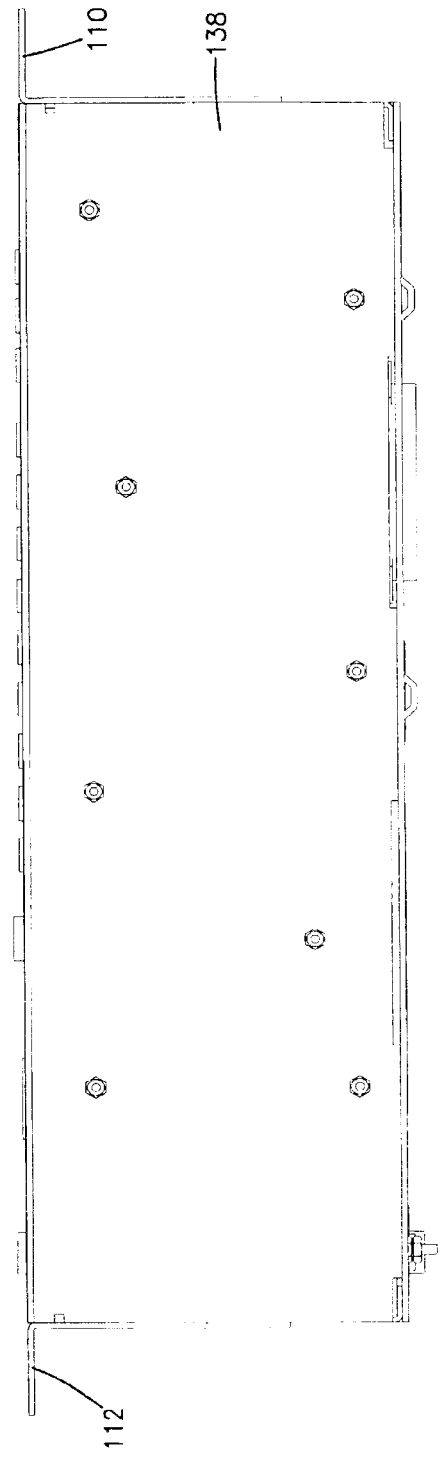

FIG.18
FIG.23
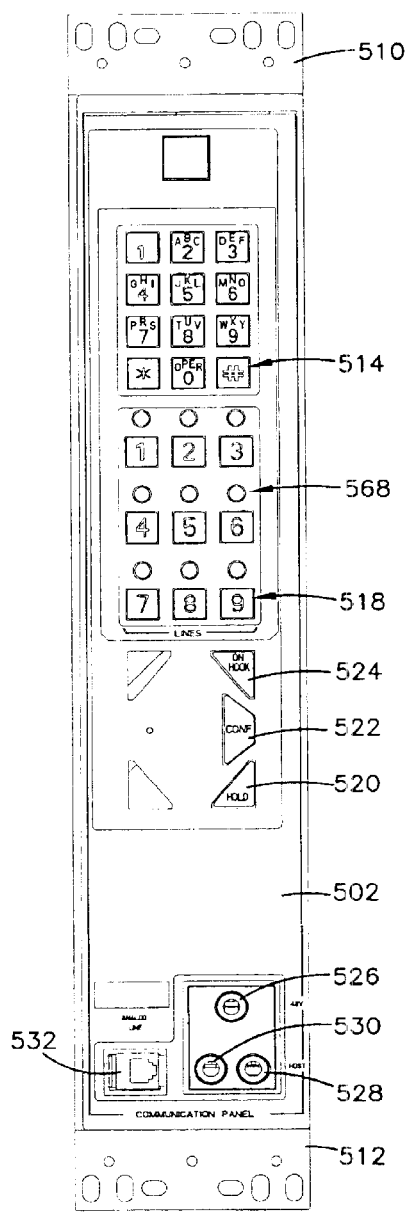
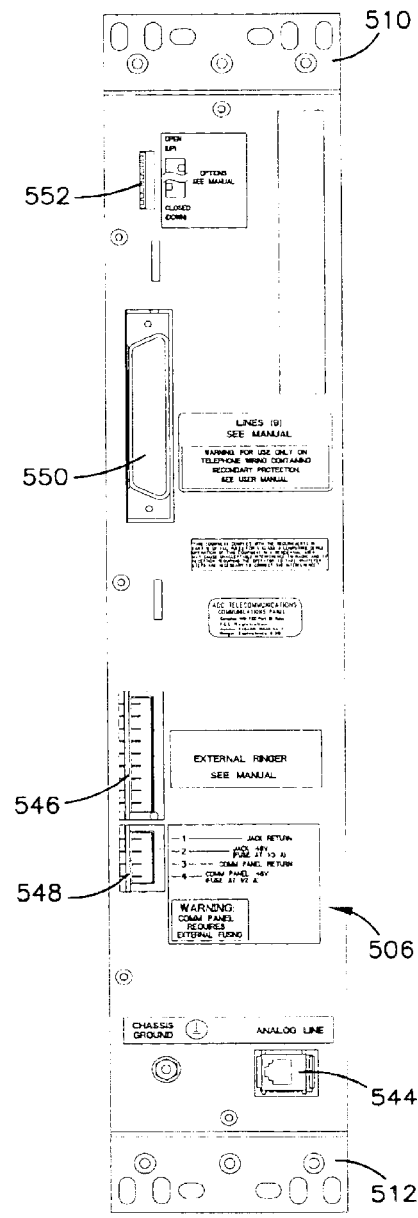

FIG.21
FIG.22
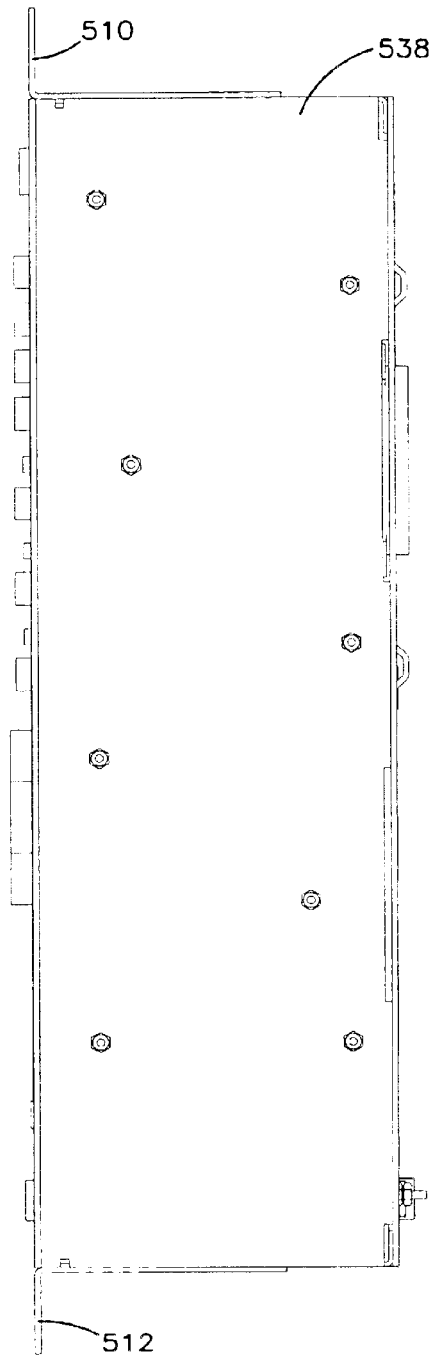
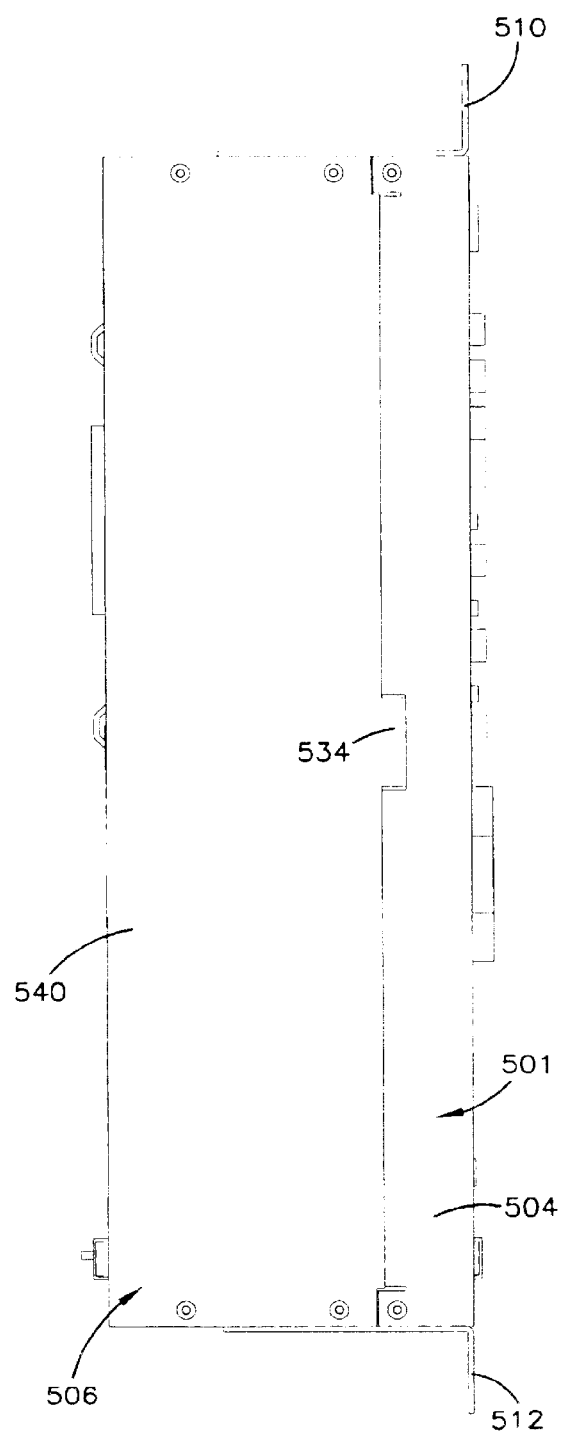

COMMUNICATION PANEL

TECHNICAL FIELD

The present invention is directed to communication panels such as those used in central offices of telecommunication networks. More specifically, the present invention is directed to communication panels with structures for facilitating maintenance and assembly and/or for keypad and integrated circuit protection.

BACKGROUND

Communication panels are generally used in central offices where other telecommunication devices are contained such as multiplexers, repeaters, etc. The communication panels are used to allow service technicians to call to various locations within the central office. The communication panel often functions as a multi-line telephone and permits the technician to establish a connection with multiple points of contact. Typically, a headset is connected to the communication panel to allow the technician to communicate verbally.

Conventionally, communication panels contain several circuit boards with circuitry for placing the calls within the central office. The circuitry includes various integrated circuits and other components mounted to the several circuit boards. One or more circuit boards pass electrical signals in response to the technician pushing keys on a keypad to select a line or dial numbers. The multiple circuit boards are typically connected with ribbon cables and are placed in a side-by-side or stacked configuration.

Maintaining the circuitry within the communication panel becomes difficult due to the multiple circuit boards and their position within the communications panel. Accessing each circuit board and all of the components on the circuit board is difficult unless the circuit boards of interest and/or ribbon cables are removed. Exterior panels further add difficulty to maintaining the communication panel because removing a single exterior surface may not adequately expose the circuit boards needing repair.

In addition to being difficult to maintain, communication panels are vulnerable due to exposed buttons on keypads that protrude from the exterior of the panel. Integrated circuits housed on the circuit boards are vulnerable to electrostatic discharge that may originate from user contact with the keypads. Thus, there is a need for communication panels that are more easily maintained and/or are less vulnerable to button or integrated circuit damage.

SUMMARY

Embodiments of the present invention provide structures that facilitate maintaining and assembling the communication panel, protect the keypad buttons, and/or protect the integrated circuits of the communication panel. Embodiments include structures such as perpendicular circuit board configurations, multi-sided removable cover surfaces, and multi-layered front panels with keypad holes.

The present invention may be viewed as a communication panel. The panel includes a first surface and a second surface substantially perpendicular to the first surface. A first printed circuit board is included and has a first connector, and a second printed circuit board is substantially perpendicular to the first printed circuit board. The second printed circuit board has a second connector mated to the first connector of the first printed circuit board. The present invention also has a cover surface having a first portion and a second portion perpendicular to the first portion. The cover surface is mounted to the first and second surfaces such that the first portion is parallel to the first surface and the second portion is parallel to the second surface, and wherein the first and second printed circuit boards are disposed within an interior region defined by the first surface, second surface, and cover surface.

The present invention may be viewed as another communication panel. The communication panel includes a first surface with a plurality of holes, and a first printed circuit board parallel to the first surface. The printed circuit board has a first connector. A first elastomeric keypad is positioned between the first surface and the first printed circuit board, and the first elastomeric keypad has a plurality of buttons that protrude through the plurality of holes of the first surface. A second printed circuit board is substantially perpendicular to the first printed circuit board, and the second printed circuit board has a second connector mated to the first connector of the first printed circuit board.

The present invention may be viewed as another communication panel. The communication panel includes a first printed circuit board that has a first connector and a plurality of electrical contacts. A first elastomeric keypad abuts the first printed circuit board, and the elastomeric keypad has a plurality of conductive contact pads aligned with the plurality of electrical contacts of the first printed circuit board. A second printed circuit board is substantially perpendicular to the first printed circuit board, and the second printed circuit board has a second connector mated to the first connector of the first printed circuit board. The second printed circuit board is in electrical communication with the plurality of contacts of the first printed circuit board through the mated first and second connectors.

The present invention may be viewed as another communication panel. The communication panel includes a first surface having a plurality of holes and a first printed circuit board parallel to the first surface. A first elastomeric keypad is positioned between a first side of the first surface and the first printed circuit board, and the first elastomeric keypad has a plurality of buttons that protrude through the plurality of holes of the first surface. A front surface has at least one opening that abuts a second side of the first surface. One or more of the plurality of buttons of the keypad protrude through the at least one opening.

DESCRIPTION OF THE DRAWINGS

FIG. 3 is a top plan view of the communication panel of FIG. 1.

FIG. 4 is a bottom plan view of the communication panel of FIG. 1.

FIG. 18 is a front elevational view of the communication panel of FIG. 17.

FIG. 21 is a right side elevational view of the communication panel of FIG. 17.

FIG. 22 is a left side elevational view of the communication panel of FIG. 17.

FIG. 23 is a rear elevational view of the communication panel of FIG. 17.

DETAILED DESCRIPTION

Figure 1:
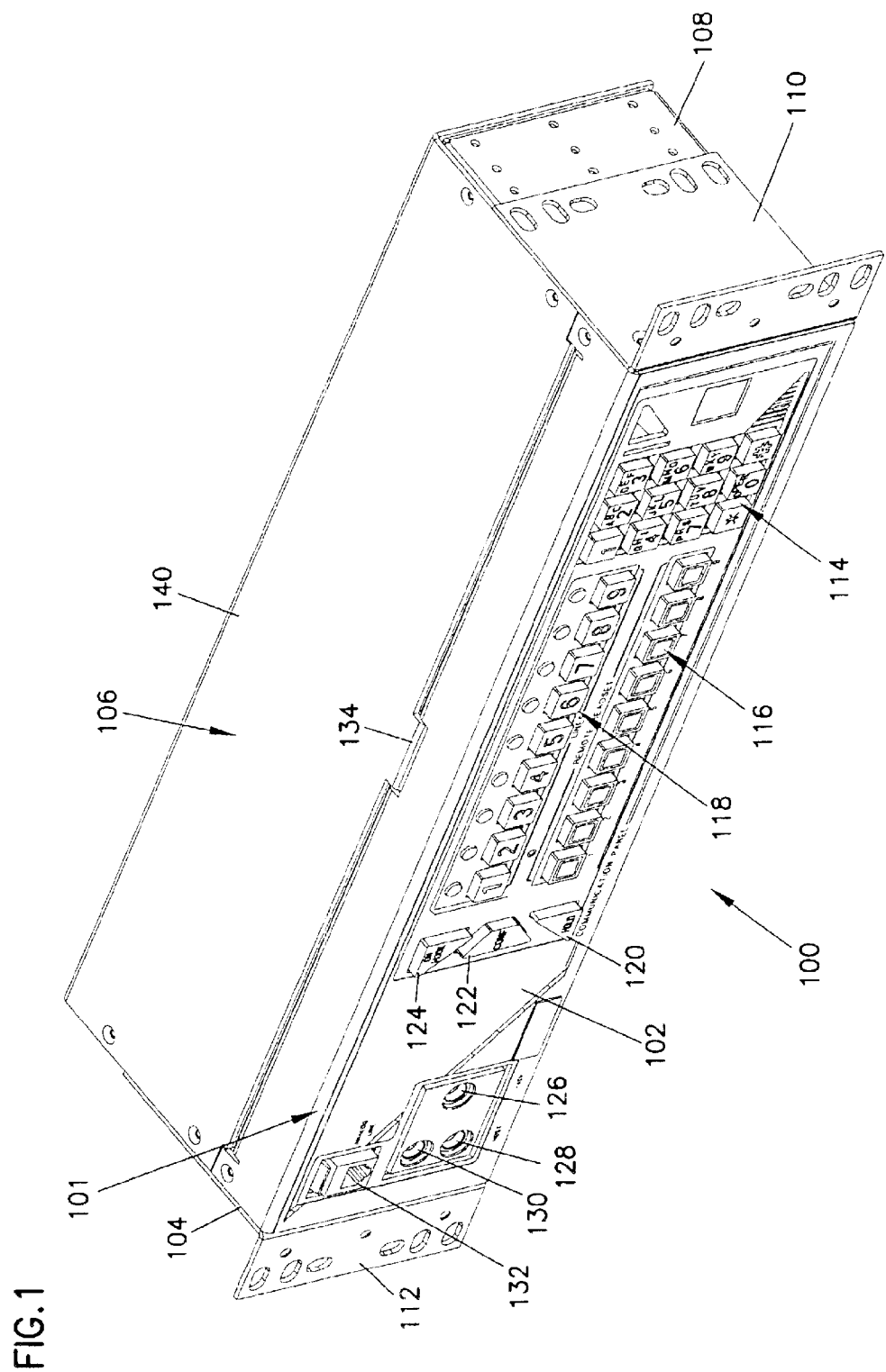
FIG. 1 is a perspective view of one embodiment of the communication panel according to the present invention.

Various embodiments of the present invention will be described in detail with reference to the drawings, wherein like reference numerals represent like parts and assemblies through the several views. Reference to various embodiments does not limit the scope of the invention, which is limited only by the scope of the claims attached hereto.

FIG. 1 shows a horizontally oriented embodiment of a communication panel 100. The communication panel 100 includes a front surface 101 that includes a top horizontal portion 104 and a front vertical portion 102. The front surface 101 includes several openings discussed in more detail below. Several buttons protrude from the front surface, including dialing buttons 114, line buttons 118, and remote headset buttons 116. Additionally, an on-hook button 124, conference button 122, and hold button 120 may protrude as well as other types of buttons performing various calling functions.

The dialing buttons 114 allow the user to dial a desired number of another location within the central office. The line button 118 allows the user to select a line to use to place a call or to select a line providing an incoming call. Remote headset buttons 116 allow the user to channel communications for a call placed from or received by the communication panel 100 to a headset plugged into another location within the central office.

An analog line jack 132, headset jacks 128, 130, and DC power jack 126 may also protrude from the front surface 101. The analog line jack 132 is a pass-through jack to the other side of the panel 100 so that a laptop computer can access an analog line by being connected to the jack 132 of the communication panel 100. The headset jacks 128, 130 allow the user to plug in a headset so that verbal communication can be established. The DC power jack 126 provides a –48 V power source for additional equipment.

The communication panel 100 also includes sides 108 and a cover surface 106 that includes a top portion 140. Top portion 140 includes an extension 134 that may fit within an opening of top horizontal portion 104 of the front surface 101 that is discussed below. Mounting brackets 110 and 112 may be mounted to the sides 108 to allow the communication panel 100 to be mounted within a rack (not shown). The brackets 110, 112 are may be mounted with the narrow side out or the wide side out so that the communication panel 100 may be mounted within racks of varying widths while using the same brackets 110, 112.

Figure 2:
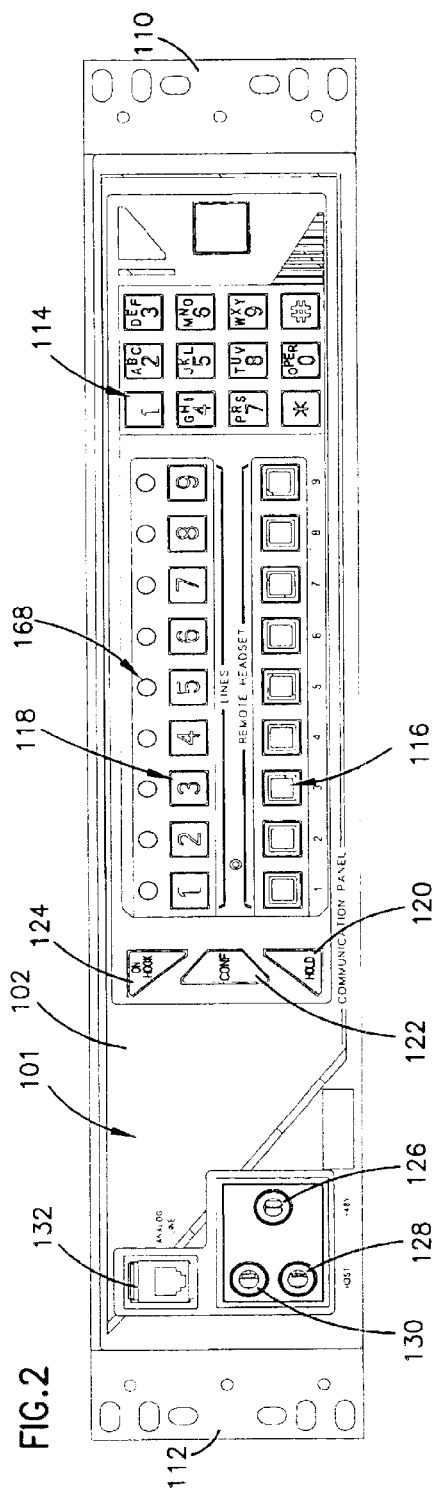
FIG. 2 is a front elevational view of the communication panel of FIG. 1.

FIG. 2 is a front view of the same embodiment. As can be seen lights 168 for each line are placed above each line button 118. Additionally, a remote headset button 116 for each line is placed underneath the corresponding line button 118. As discussed below, many of the buttons such as the line buttons 118 and remote headset buttons may light up to provide extra visibility.

FIG. 3 is a top view and FIG. 4 is a bottom view of the same embodiment. As shown in FIG. 3, the line buttons 118 extend only a very small distance beyond the front surface 101 of the panel 100 so that they are not as vulnerable as they would be if they extended the full distance of their travel beyond the front surface 101. Using multiple front surfaces allows the buttons to maintain their depression travel while reducing their extension beyond the outermost surface 101.

Figure 6:
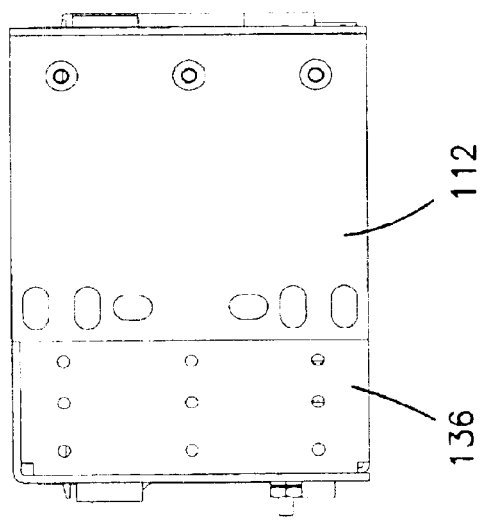
FIG. 6 is a left side elevational view of the communication panel of FIG. 1.
Figure 5:
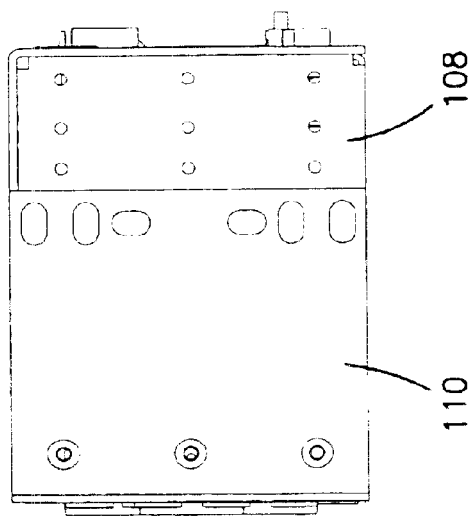
FIG. 5 is a right side elevational view of the communication panel of FIG. 1.

As shown in FIG. 4, the communications panel 100 has a bottom surface 138. As discussed below, bottom surface 138 may be formed from a continuous sheet of metal also used to form the sides 108, 136. FIGS. 5 and 6 are right and left side views respectively, with the wide portion of the brackets 110, 112 mounted to the right and left sides 108, 136 respectively of the communication panel 100. As shown, the brackets 110, 112 have multiple hole-patterns for installation of the communication panel in various racks such as WECO and EIA rack configurations.

Figure 7:
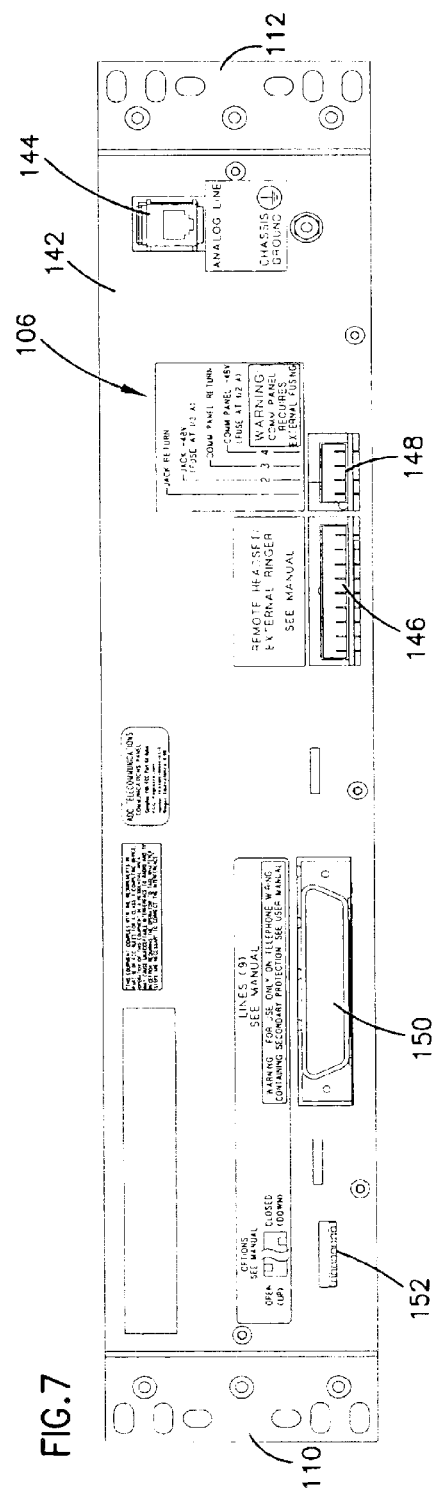
FIG. 7 is a rear elevational view of the communication panel of FIG. 1.

FIG. 7 is a rear view of the communication panel 100. The cover surface 106 of the communication panel includes a rear portion 142 that is perpendicular to the top portion 140. Several connectors protrude from the rear portion 142 including an analog pass through jack 144 that is linked to the analog jack 132 protruding from the front surface 101. A power supply connector 148 may be included to receive –48 V power used by the communication panel 100 and –48 V power supplied to the power jack 126 protruding from the front surface 101.

An external connection jack 146 may be included to provide connection to an external ringer to alert the user when a call is incoming. The external connection jack 146 may also provide electrical connections that are routed to various locations within the central office where the remote headsets are located. The remote headset buttons 116 protruding from the front surface 101 activate these electrical connections of the remote headsets.

A communication line jack 150 is included to provide electrical connections for the various communication lines selected by line buttons 118 protruding from the front surface 101. Multi-switch 152 provides various switches that may be positioned on or off to select various modes of operation for the communication panel, including whether tone or pulse dialing is used.

Figure 8:
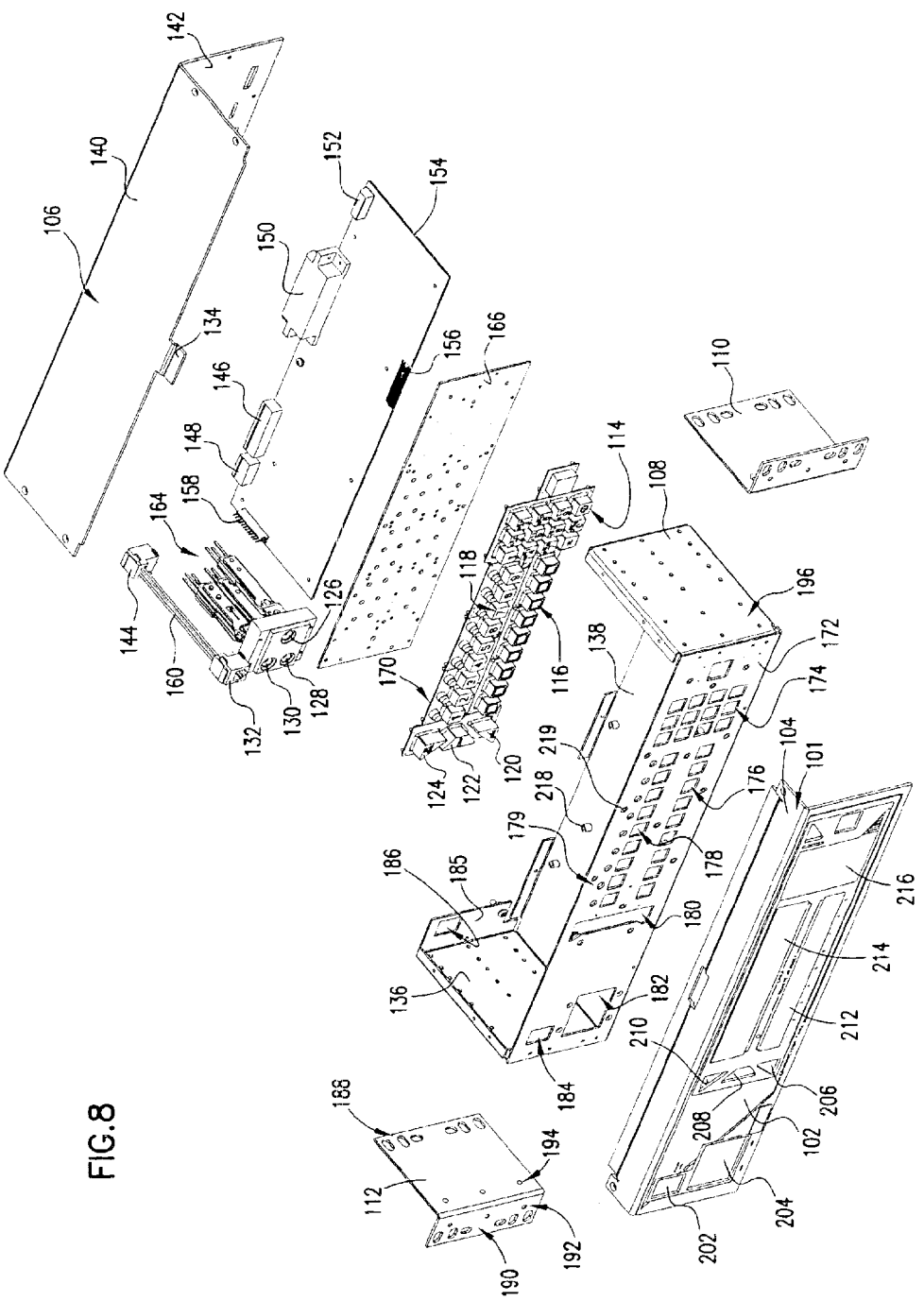
FIG. 8 is an exploded view of the communication panel of FIG. 1.

FIG. 8 is an exploded view of the communication panel 100. As can be seen, the front surface 101 mounts to a second vertical surface 172 that interconnects the vertical sidewalls 108, 136. The bottom surface 138 is also formed together with the second vertical surface 172 and sidewalls 108, 136 from the same sheet of metal. These surfaces as well as the front surface 101, cover surface 106, and brackets 110, 112 may be made from a cold-rolled steel material or aluminum.

The second vertical surface 172 may contain several openings such as opening 184 that allows the analog jack 132 to protrude through. Opening 182 allows a jack plate 162 containing the headset jacks 128, 130 and power jack 1 26 to protrude through. Opening 180 allows on-hook button 124, conference button 122, and hold button 120 to protrude through. Openings 178 allow the line buttons 118 to protrude through. Openings 179 allow the line lights 168 to protrude through. Openings 176 allow the remote headset buttons 116 to protrude through. Openings 174 allow the dialing buttons 114 to protrude through.

Similarly, the front surface 101 has several openings that allow the jacks and buttons to protrude through. Opening 202 allows the analog jack 132 to protrude through. Opening 204 allows the jack plate 162 to protrude through. Opening 206 allows the hold button 120 to protrude through. Opening 208 allows the conference button 122 to protrude through. Opening 210 allows the on-hook button 124 to protrude through. Opening 212 allows the remote headset buttons 116 to protrude through. Opening 214 allows the line buttons 118 to protrude through. Opening 216 allows the dialing buttons 114 to protrude through.

The front surface 101 also has a lip 198 on the top horizontal portion 104 that abuts the top portion 104 of the cover surface 106. The lip 198 includes opening 200 that receives the extension 134 of the top portion 140 of the cover surface 106. The top portion 140 and rear portion 142 of the cover surface 106 also abuts the sidewalls 108, 136. The rear portion 142 of the cover surface 106 also abuts the bottom surface 138.

The brackets 110, 112 include the narrow portion 190 and wide portion 188 that are perpendicularly arranged. The narrow portion 190 includes mounting holes 192 and the wide portion 188 includes mounting holes 194. The sidewalls 108, 136 have several sets of mounting holes 196 that align with the mounting holes 192 or 194 to allow the brackets 110, 112 to be mounted in several positions on the sidewalls 108, 136. These several sets of mounting holes 196 allow the amount of extension of the panel 100 from the rack to be variable.

The sidewall 136 is continuous with a rear extension 185 that includes a rear hole 186. The hole 186 allows the analog jack 144 to protrude through. The analog jack 144 is directly linked to the front analog jack 132 through conductors 160. The headset and power jacks 128, 130, and 126 include conductors 164 that may be connected to the main circuit board 154 through wires (not shown) attached to a connector 158. The connector 158 is mounted directly to the circuit board 154, along with the power connector 148, ringer/headset connector 146, line connector 150, and multi-switch 152.

The main circuit board 154 is mounted to the bottom surface 138 by inserts 218, such as PEM inserts, that attach to the metal bottom surface 138. The main circuit board 154 then rests on the PEM inserts 218. Similarly, a keypad circuit board 166 is mounted to the second vertical surface 172 through PEM inserts 219 that attach to the metal vertical surface 172. The keypad circuit board 166, which is positioned perpendicular to the main circuit board 154, is electrically linked to the circuit board through a connector (shown schematically in FIG. 25) that engages connector 156 of the main circuit board 154 thereby eliminating ribbon cables connections between the circuit boards. The connector 156 is a right angle surface mount dual row header connector such as those manufactured by Samtec. The circuit boards 154, 166 thus lie within an interior region of the panel 100 defined by the vertical surface 172, sides 108, 136, top 140, rear 142, and bottom 138.

An elastomeric pad 170, such as silicone rubber, with line indicator covers 168, line buttons 118, headset buttons 116, dialing buttons 114, and other buttons is placed between the keypad circuit board 166 and the vertical surface 172. The elastomeric keypad 170 can be cut apart into various sections, as shown below with reference to second and third alternative embodiments. As discussed with reference to FIG. 26, the keypad includes four carbon contacts for each button that contact an electrical contact on the keypad circuit board 166 to complete a circuit.

Figure 9:
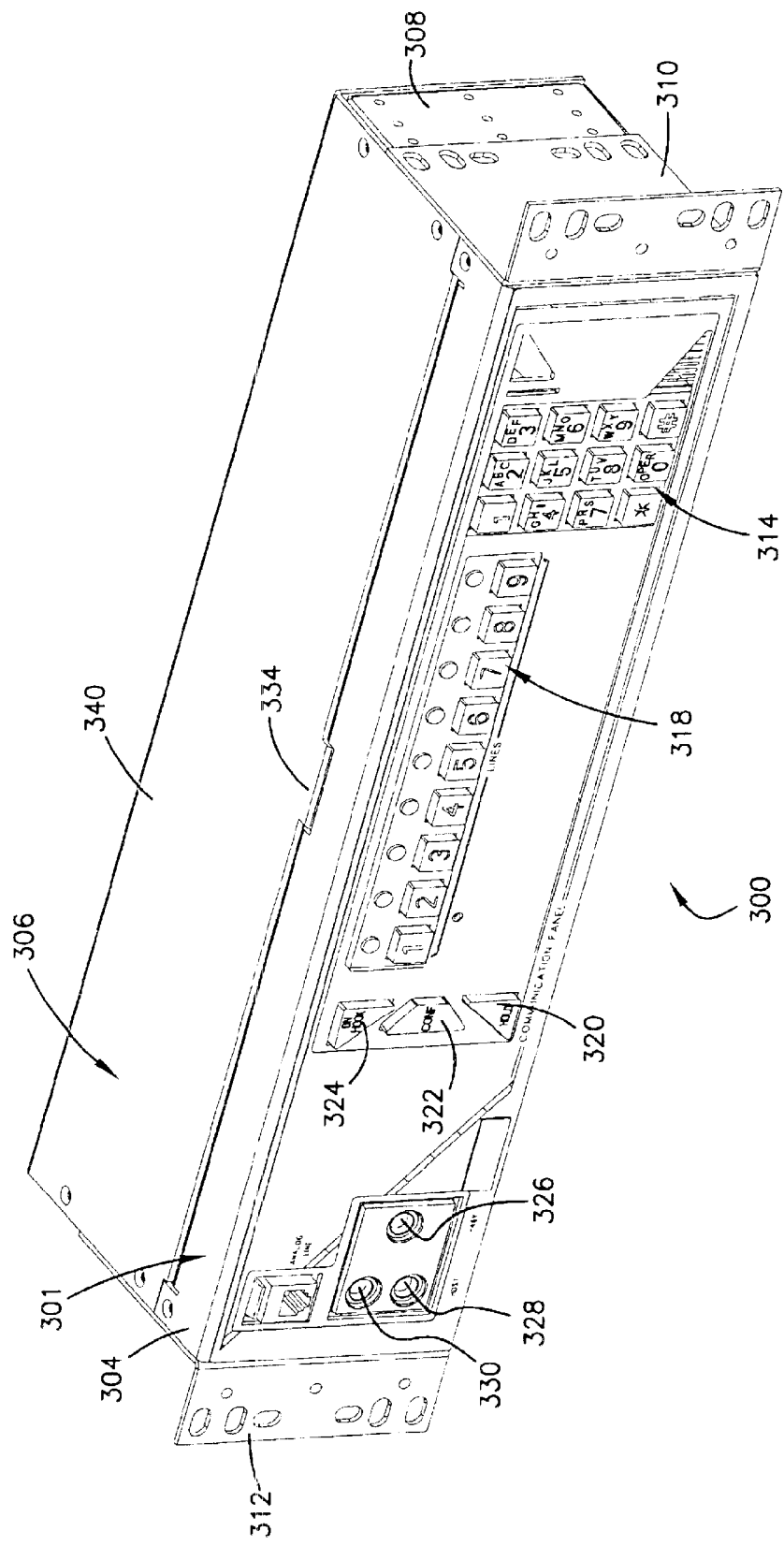
FIG. 9 is a perspective view of a second embodiment of the communication panel according to the present invention.

FIG. 9 shows a second horizontally oriented embodiment of a communication panel 300 that is similar to the first embodiment but lacks the remote headset buttons. The communication panel 300 includes a front surface 301 that includes a top horizontal portion 304 and a front vertical portion 302. The front surface 301 includes several openings discussed in more detail below. Several buttons protrude from the front surface, including dialing buttons 314 and line buttons 318. Additionally, an on-hook button 324, conference button 322, and hold button 320 may protrude as well as other types of buttons performing various calling functions.

As with the previous embodiment, the dialing buttons 314 allow the user to dial a desired number of another location within the central office, and the line button 318 allows the user to select a line to use to place a call or to select a line providing an incoming call. An analog line jack 332, headset jacks 328, 330, and DC power jack 326 may also protrude from the front surface 301. The analog line jack 332 is a pass-through jack to the other side of the panel 300 so that a laptop computer can access an analog line by being connected to the jack 332 of the communication panel 300. The headset jacks 328, 330 allow the user to plug in a headset so that verbal communication can be established. The DC power jack 326 provides a −48 V power source for additional equipment.

The communication panel 300 also includes sides 308, 336 and a cover surface 306 that includes a top portion 340. Top portion 340 includes an extension 334 that may fit within an opening of top horizontal portion 304 of the front surface 301 that is discussed below. Mounting brackets 310 and 312 may be mounted to the sides 308, 336 to allow the communication panel 300 to be mounted within a rack (not shown). The brackets 310, 312 are may be mounted with the narrow side out or the wide side out so that the communication panel 300 may be mounted within racks of varying widths while using the same brackets 310, 312.

Figure 10:
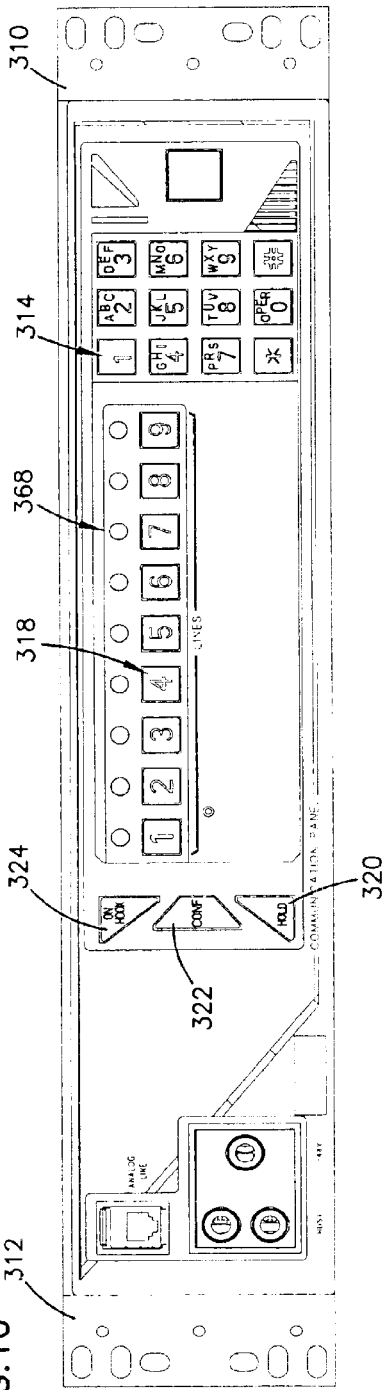
FIG. 10 is a front elevational view of the communication panel of FIG. 9.

FIG. 10 is a front view of the same embodiment. As can be seen lights 368 for each line are placed above each line button 318. As discussed below, many of the buttons such as the line buttons 318 may light up to provide extra visibility.

Figure 11:
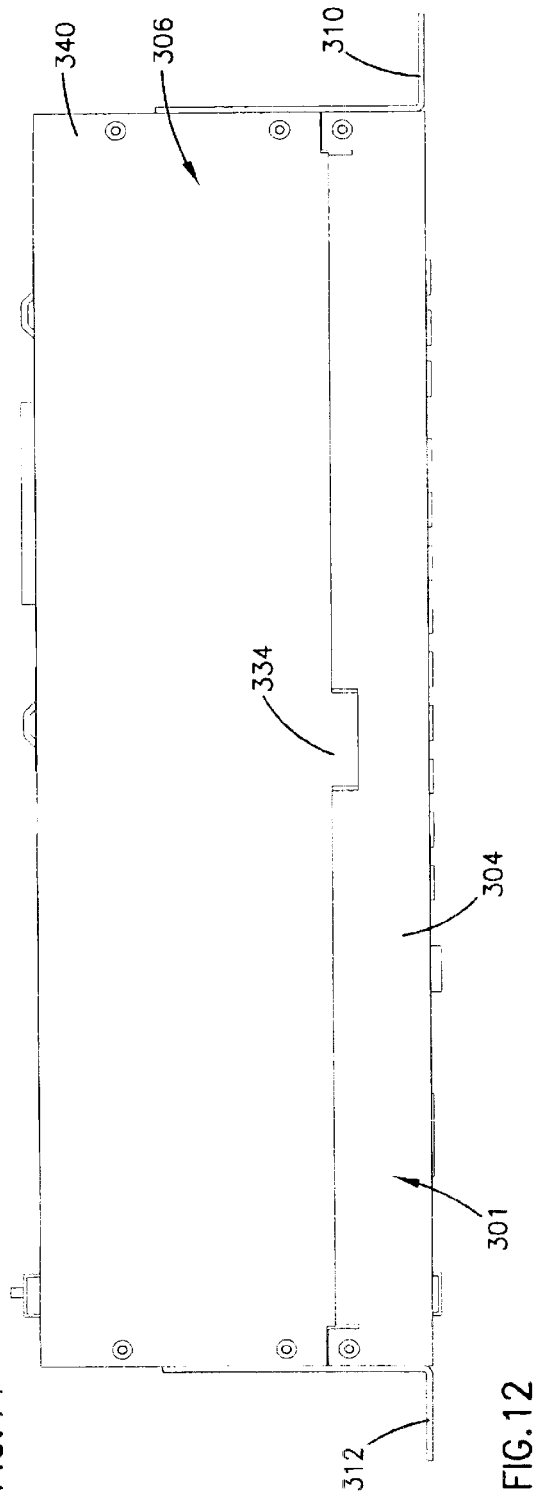
FIG. 11 is a top plan view of the communication panel of FIG. 9.
Figure 12:
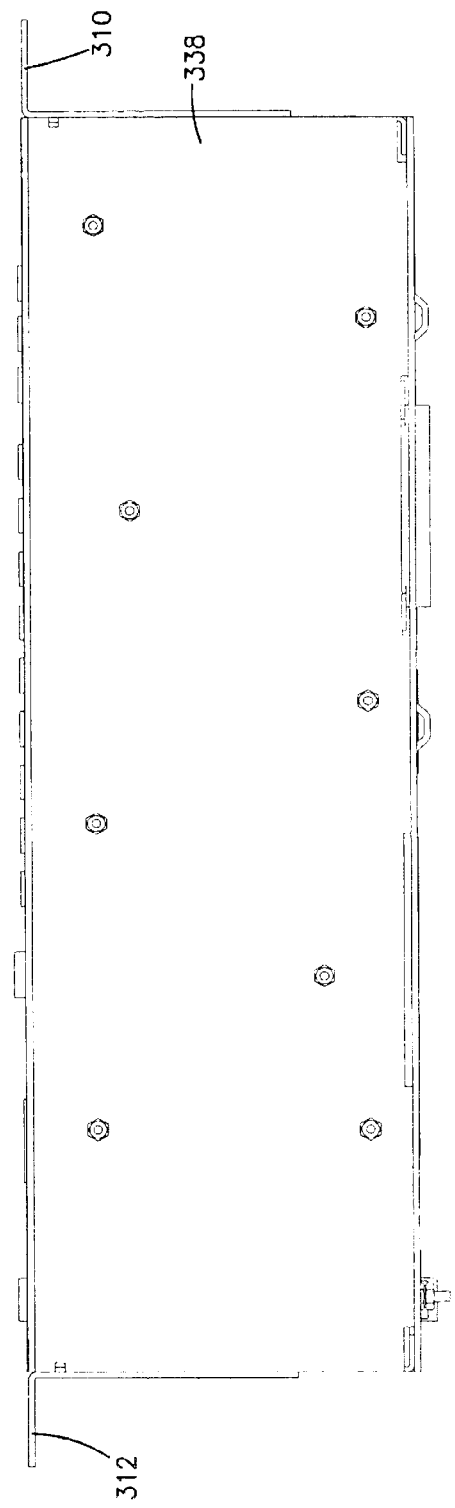
FIG. 12 is a bottom plan view of the communication panel of FIG. 9.

FIG. 11 is a top view and FIG. 12 is a bottom view of the same embodiment. As shown in FIG. 11, the line buttons 318 extend only a very small distance beyond the front surface 301 of the panel 300 so that they are not as vulnerable as they would be if they extended the full distance of their travel beyond the front surface 301. Using multiple front surfaces allows the buttons to maintain their depression travel while reducing their extension beyond the outermost surface 301.

Figure 14:
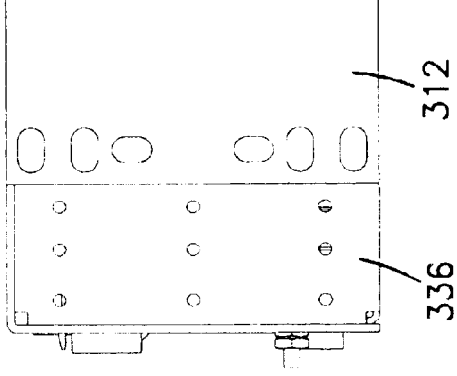
FIG. 14 is a left side elevational view of the communication panel of FIG. 9.
Figure 13:
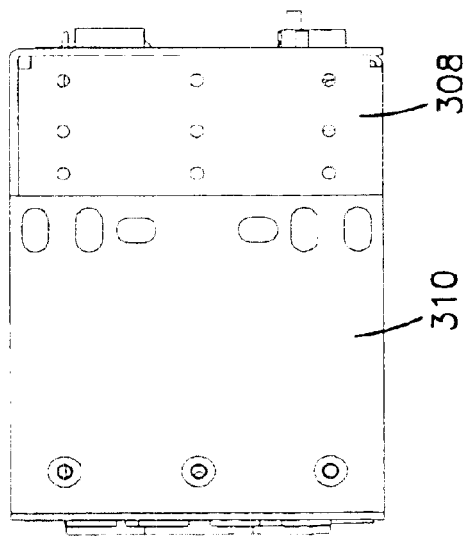
FIG. 13 is a right side elevational view of the communication panel of FIG. 9.

As shown in FIG. 12, the communications panel 300 has a bottom surface 338. As discussed below, bottom surface 338 may be formed from a continuous sheet of metal also used to form the sides 308, 336. FIGS. 13 and 14 are right and left side views respectively, with the wide portion of the brackets 310, 312 mounted to the right and left sides 308, 336 respectively of the communication panel 300. As shown, the brackets 310, 312 have multiple hole-patterns for installation of the communication panel in various racks such as WECO and EIA rack configurations.

Figure 15:
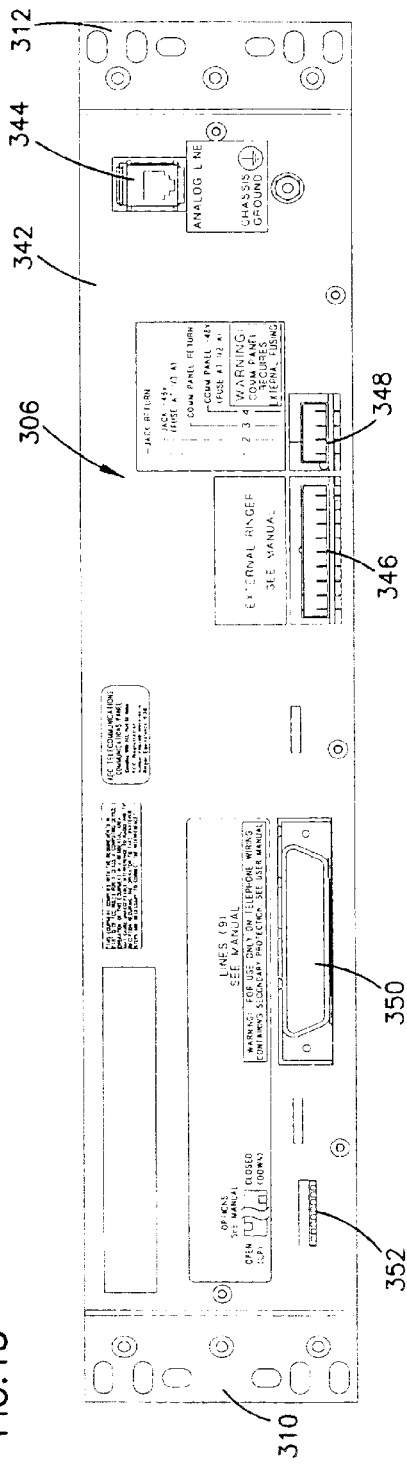
FIG. 15 is a rear elevational view of the communication panel of FIG. 9.

FIG. 15 is a rear view of the communication panel 300. The cover surface 306 of the communication panel includes a rear portion 342 that is perpendicular to the top portion 340. Several connectors protrude from the rear portion 342 including an analog pass through jack 344 that is linked to the analog jack 332 protruding from the front surface 301. A power supply connector 348 may be included to receive −48 V power used by the communication panel 300 and −48 V power supplied to the power jack 326 protruding from the front surface 301.

An external connection jack 346 may be included to provide connection to an external ringer to alert the user when a call is incoming. A communication line jack 350 is included to provide electrical connections for the various communication lines selected by line buttons 318 protruding from the front surface 301. Multi-switch 352 provides various switches that may be positioned on or off to select various modes of operation for the communication panel, including whether tone or pulse dialing is used.

Figure 16:
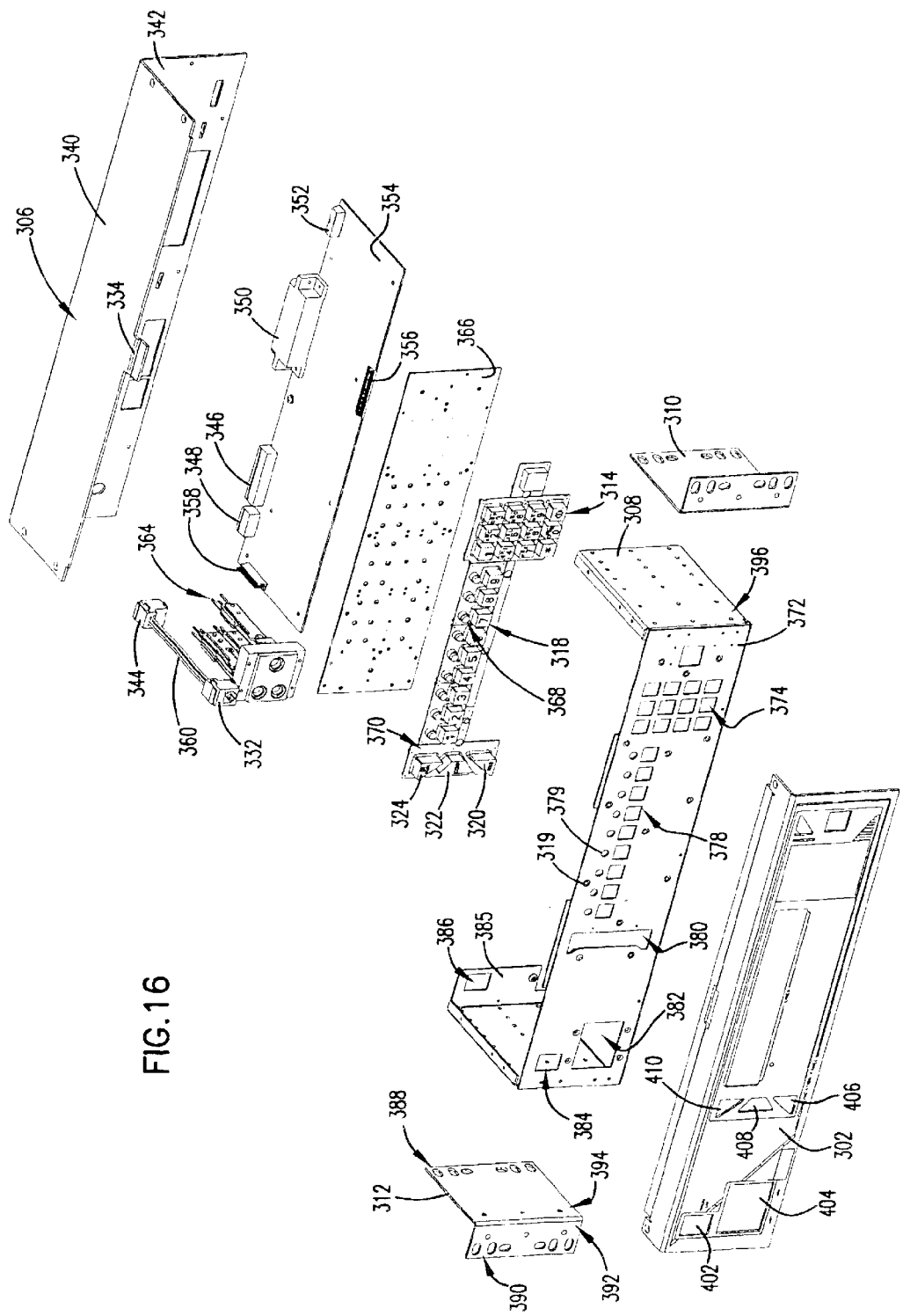
FIG. 16 is an exploded view of the communication panel of FIG. 9.

FIG. 16 is an exploded view of the communication panel 300. As can be seen, the front surface 301 mounts to a second vertical surface 372 that interconnects the vertical sidewalls 308, 336. The bottom surface 338 is also formed together with the second vertical surface 372 and sidewalls 308, 336 from the same sheet of metal. As with the previous embodiment, these surfaces as well as the front surface 301, cover surface 306, and brackets 310, 312 may be made from a cold-rolled steel material or aluminum.

The second vertical surface 372 may contain several openings such as opening 384 that allows the analog jack 332 to protrude through. Opening 382 allows a jack plate 362 containing the headset jacks 328, 330 and power jack 326 to protrude through. Opening 380 allows on-hook button 324, conference button 322, and hold button 320 to protrude through. Openings 378 allow the line buttons 318 to protrude through. Openings 379 allow the line lights 368 to protrude through. Openings 374 allow the dialing buttons 314 to protrude through.

Similarly, the front surface 301 has several openings that allow the jacks and buttons to protrude through. Opening 402 allows the analog jack 332 to protrude through. Opening 404 allows the jack plate 362 to protrude through. Opening 406 allows the hold button 320 to protrude through. Opening 408 allows the conference button 322 to protrude through. Opening 410 allows the on-hook button 324 to protrude through. Opening 414 allows the line buttons 318 to protrude through. Opening 416 allows the dialing buttons 314 to protrude through.

The front surface 301 also has a lip 398 on the top horizontal portion 304 that abuts the top portion 304 of the cover surface 306. The lip 398 includes opening 400 that receives the extension 334 of the top portion 340 of the cover surface 306. The top portion 340 and rear portion 342 of the cover surface 306 also abuts the sidewalls 308, 336. The rear portion 342 of the cover surface 306 also abuts the bottom surface 338.

The brackets 310, 312 include the narrow portion 390 and wide portion 388 that are perpendicularly arranged. The narrow portion 390 includes mounting holes 392 and the wide portion 388 includes mounting holes 394. The sidewalls 308, 336 have several sets of mounting holes 396 that align with the mounting holes 392 or 394 to allow the brackets 310, 312 to be mounted in several positions on the sidewalls 308, 336. These several sets of mounting holes 396 allow the amount of extension of the panel 300 from the rack to be variable.

The sidewall 336 is continuous with a rear extension 385 that includes a rear hole 386. The hole 386 allows the analog jack 344 to protrude through. The analog jack 344 is directly linked to the front analog jack 332 through conductors 360. The headset and power jacks 328, 330, and 326 include conductors 364 that may be connected to the main circuit board 354 through wires (not shown) attached to a connector 358. The connector 358 is mounted directly to the circuit board 354, along with the power connector 348, ringer connector 346, line connector 350, and multi-switch 352.

The main circuit board 354 is mounted to the bottom surface 338 by inserts, such as PEM inserts, that attach to the metal bottom surface 338. The main circuit board 354 then rests on the PEM inserts. Similarly, a keypad circuit board 366 is mounted to the second vertical surface 372 through PEM inserts 319 that attach to the metal vertical surface 372. The keypad circuit board 366, which is positioned perpendicular to the main circuit board 354, is electrically linked to the circuit board through a connector (such as that shown schematically in FIG. 25) that engages connector 356 of the main circuit board 354 thereby eliminating ribbon cables connections between the circuit boards. As with the previous embodiment, the connector 356 is a right angle surface mount dual row header connector. The circuit boards 354, 366 thus lie within an interior region of the panel 300 defined by the vertical surface 372, sides 308, 336, top 340, rear 342, and bottom 338.

A elastomeric keypad 370 with line indicator covers 368, line buttons 318, dialing buttons 314, and other buttons is placed between the keypad circuit board 366 and the vertical surface 372. As shown, the remote headset button portion has been entirely removed from the keypad 370 as this embodiment does not employ remote headsets. The elastomeric keypad 370 can be further cut apart into various sections, as shown below with reference to the third alternative embodiment. In accordance with the discussion in relation to FIG. 26, the keypad 370 includes four carbon contacts for each button that contact an electrical contact on the keypad circuit board 366 to complete a circuit.

Figure 17:
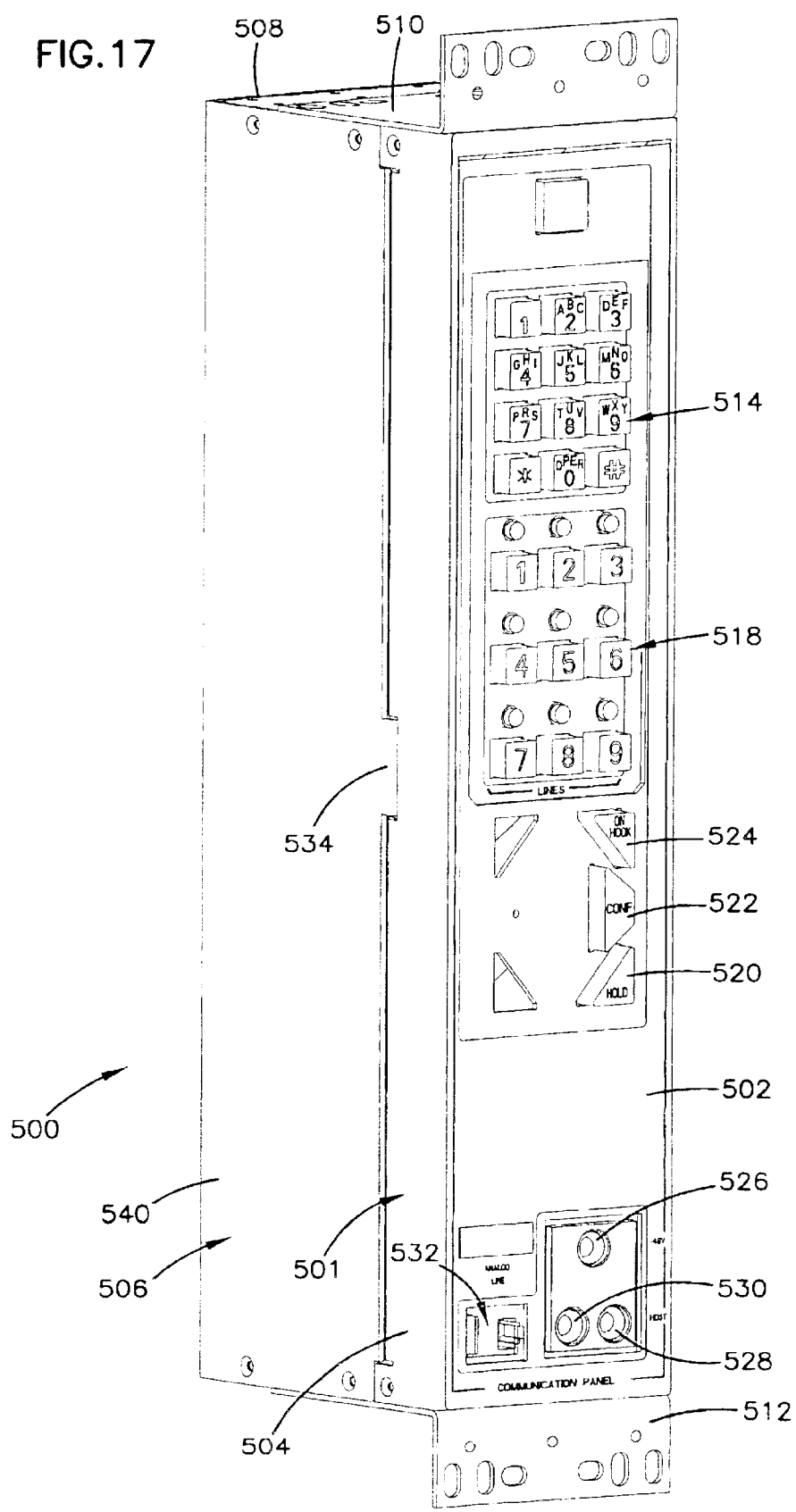
FIG. 17 is a perspective view of a third embodiment of the communication panel according to the present invention.

FIG. 17 shows a vertically oriented third embodiment of a communication panel 500 that is similar to the second embodiment but is configured to be mounted vertically between two racks. The communication panel 500 includes a front surface 501 that includes a left vertical portion 504 and a front vertical portion 502. The front surface 501 includes several openings discussed in more detail below. Several buttons protrude from the front surface 501, including dialing buttons 514 and line buttons 518. Additionally, an on-hook button 524, conference button 522, and hold button 520 may protrude as well as other types of buttons performing various calling functions.

As with the previous embodiments, the dialing buttons 514 allow the user to dial a desired number of another location within the central office, and the line button 518 allows the user to select a line to use to place a call or to select a line providing an incoming call. An analog line jack 532, headset jacks 528, 530, and DC power jack 526 may also protrude from the front surface 501. The analog line jack 532 is a pass-through jack to the other side of the panel 500 so that a laptop computer can access an analog line by being connected to the jack 532 of the communication panel 500. The headset jacks 528, 530 allow the user to plug in a headset so that verbal communication can be established. The DC power jack 526 provides a −48 V power source for additional equipment.

The communication panel 500 also includes top surface 508, bottom surface 536, and a cover surface 506 that includes a left portion 540. Left portion 540 includes an extension 534 that may fit within an opening of left vertical portion 504 of the front surface 501 that is discussed below. Mounting brackets 510 and 512 may be mounted to the top 508 and bottom 536 to allow the communication panel 500 to be mounted between two racks (not shown). The brackets 510, 512 are may be mounted with the narrow side out or the wide side out so that the communication panel 500 may be mounted within racks with mounting holes of varying separation while using the same brackets 510, 512.

FIG. 18 is a front view of the same embodiment. As can be seen light 568 for each line are placed above each line button 518. As discussed below, many of the buttons such as the line buttons 518 may light up to provide extra visibility.

Figure 19:
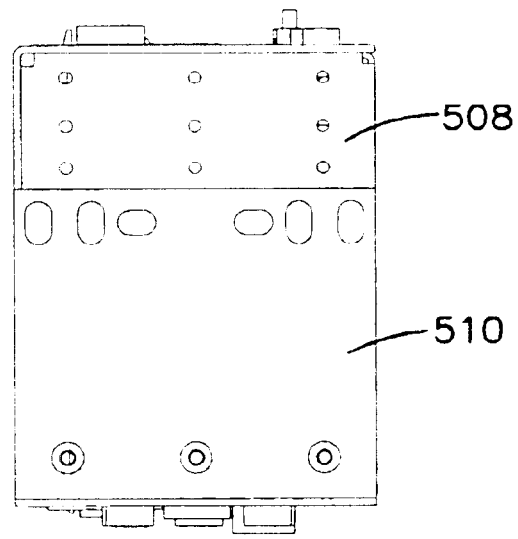
FIG. 19 is a top plan view of the communication panel of FIG. 17.
Figure 20:
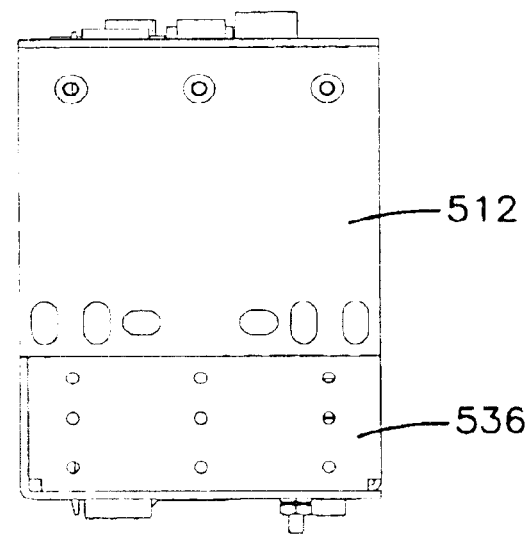
FIG. 20 is a bottom plan view of the communication panel of FIG. 17.

FIG. 19 is a top view and FIG. 20 is a bottom view of the same embodiment. As shown in FIG. 19, the line buttons 518 extend only a very small distance beyond the front surface 501 of the panel 500 so that they are not as vulnerable as they would be if they extended the full distance of their travel beyond the front surface 501. Using multiple front surfaces allows the buttons to maintain their depression travel while reducing their extension beyond the outermost surface 501.

As shown in FIG. 21, the communications panel 500 has a right side surface 538. As discussed below, right side surface 538 may be formed from a continuous sheet of metal also used to form the top and bottom 508, 536. As shown in FIGS. 19 and 20, the brackets 510, 512 have multiple hole-patterns for installation of the communication panel in various racks such as WECO and EIA rack configurations.

FIG. 23 is a rear view of the communication panel 500. The cover surface 506 of the communication panel includes a rear portion 542 that is perpendicular to the left portion 540. Several connectors protrude from the rear portion 542 including an analog pass through jack 544 that is linked to the analog jack 532 protruding from the front surface 501. A power supply connector 548 may be included to receive −48 V power used by the communication panel 500 and −48 V power supplied to the power jack 526 protruding from the front surface 501.

An external connection jack 546 may be included to provide connection to an external ringer to alert the user when a call is incoming. A communication line jack 550 is included to provide electrical connections for the various communication lines selected by line buttons 518 protruding from the front surface 501. Multi-switch 552 provides various switches that may be positioned on or off to select various modes of operation for the communication panel 500, including whether tone or pulse dialing is used.

Figure 24:
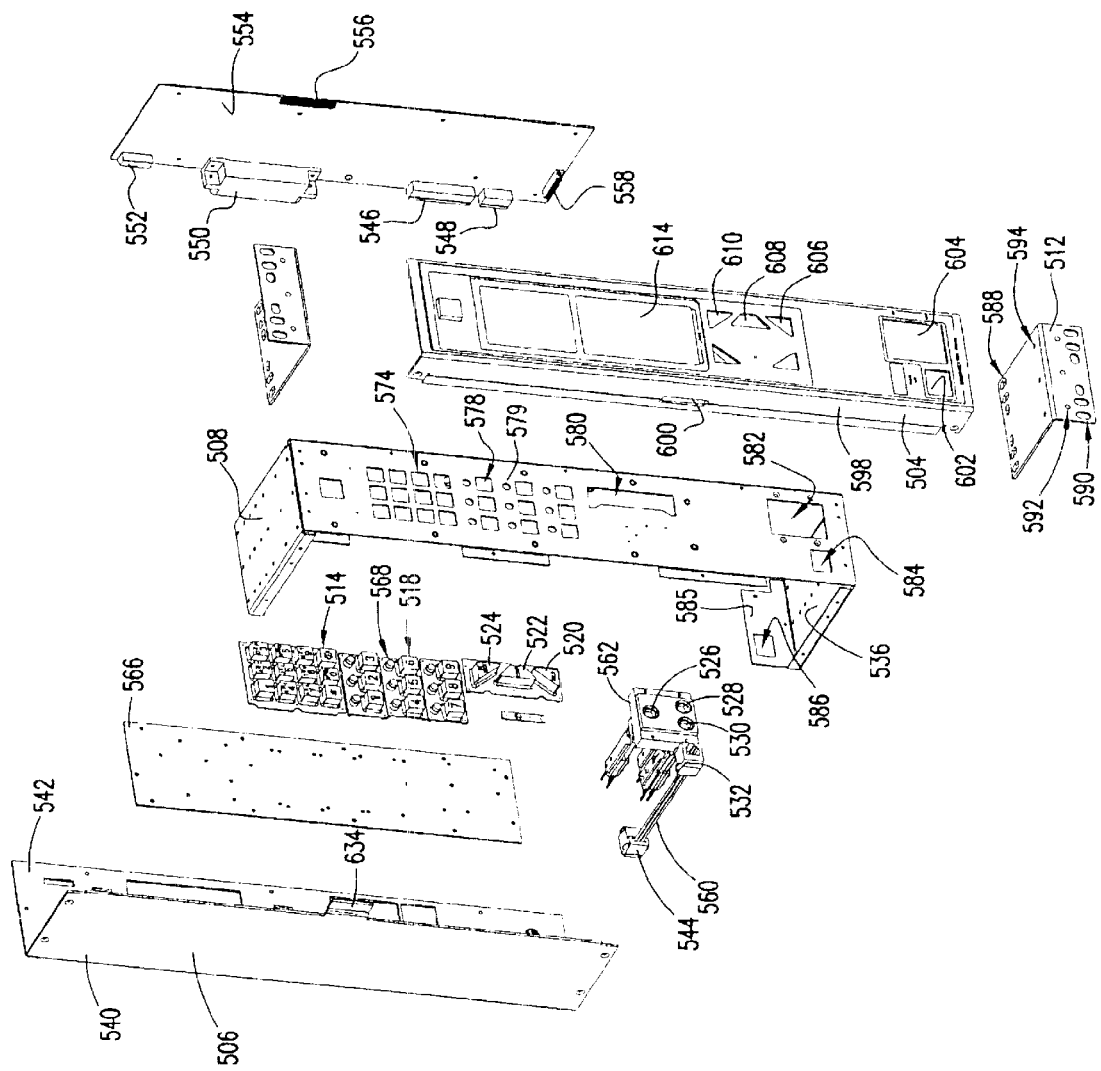
FIG. 24 is an exploded view of the communication panel of FIG. 17.

FIG. 24 is an exploded view of the communication panel 500. As can be seen, the front surface 501 mounts to a second vertical surface 572 that interconnects the top and bottom 508, 536. The right side surface 538 is also formed together with the second vertical surface 572 and top and bottom 508, 536 from the same sheet of metal. As with the previous embodiments, these surfaces as well as the front surface 501, cover surface 506, and brackets 510, 512 maybe made from a cold-rolled steel material or aluminum.

The second vertical surface 572 may contain several openings such as opening 584 that allows the analog jack 532 to protrude through. Opening 582 allows a jack plate 562 containing the headset jacks 528, 530 and power jack 526 to protrude through. Opening 580 allows on-hook button 524, conference button 522, and hold button 520 to protrude through. Openings 578 allow the line buttons 518 to protrude through. Openings 579 allow the line lights 568 to protrude through. Openings 574 allow the dialing buttons 514 to protrude through.

Similarly, the front surface 501 has several openings that allow the jacks and buttons to protrude through. Opening 602 allows the analog jack 532 to protrude through. Opening 604 allows the jack plate 562 to protrude through. Opening 606 allows the hold button 520 to protrude through. Opening 608 allows the conference button 522 to protrude through. Opening 610 allows the on-hook button 524 to protrude through. Opening 614 allows the line buttons 518 to protrude through. Opening 616 allows the dialing buttons 514 to protrude through.

The front surface 501 also has a lip 598 on the left vertical portion 504 that abuts the left portion 504 of the cover surface 506. The lip 598 includes opening 600 that receives the extension 634 of the left portion 540 of the cover surface 506. The left portion 540 and rear portion 542 of the cover surface 506 also abuts the top and bottom 508, 536. The rear portion 542 of the cover surface 506 also abuts the right side surface 538.

The brackets 510, 512 include the narrow portion 590 and wide portion 588 that are perpendicularly arranged. The narrow portion 590 includes mounting holes 592 and the wide portion 588 includes mounting holes 594. The top and bottom 508, 536 have several sets of mounting holes 596 that align with the mounting holes 592 or 594 to allow the brackets 510, 512 to be mounted in several positions on the top and bottom 508, 536. These several sets of mounting holes 596 allow the amount of extension of the panel 500 from the racks to be variable.

The bottom 536 is continuous with a rear extension 585 that includes a rear hole 586. The hole 586 allows the analog jack 544 to protrude through. The analog jack 544 is directly linked to the front analog jack 532 through conductors 560. The headset and power jacks 528, 530, and 526 include conductors 564 that may be connected to the main circuit board 554 through wires (not shown) attached to a connector 558. The connector 558 is mounted directly to the circuit board 554, along with the power connector 548, ringer connector 546, line connector 550, and multi switch 552.

The main circuit board 554 is mounted to the right side surface 538 by inserts, such as PEM inserts, that attach to the metal bottom surface 538. The main circuit board 554 then rests on the PEM inserts. Similarly, a keypad circuit board 566 is mounted to the second vertical surface 572 through PEM inserts 519 that attach to the metal vertical surface 572. The keypad circuit board 566, which is positioned perpendicular to the main circuit board 554, is electrically linked to the circuit board through a connector (such as that shown schematically in FIG. 25) that engages connector 556 of the main circuit board 554 thereby eliminating ribbon cables connections between the circuit boards. As with the previous embodiments, the connector 556 is a right angle surface mount dual row header connector. The circuit boards 554, 566 thus lie within an interior region of the panel 500 defined by the vertical surface 572, sides 540, 538, top 508, rear 542, and bottom 536.

A elastomeric keypad 570 with line indicator covers 568, line buttons 518, dialing buttons 514, and other buttons is placed between the keypad circuit board 566 and the vertical surface 572. As shown, the remote headset button portion has been entirely removed from the keypad 570 as this embodiment does not employ remote headsets. Additionally, the elastomeric keypad 570 has been further cut apart into various sections. In accordance with the discussion in relation to FIG. 26, the keypad 570 includes four carbon contacts for each button that contact an electrical contact on the keypad circuit board 566 to complete a circuit.

Figure 25:
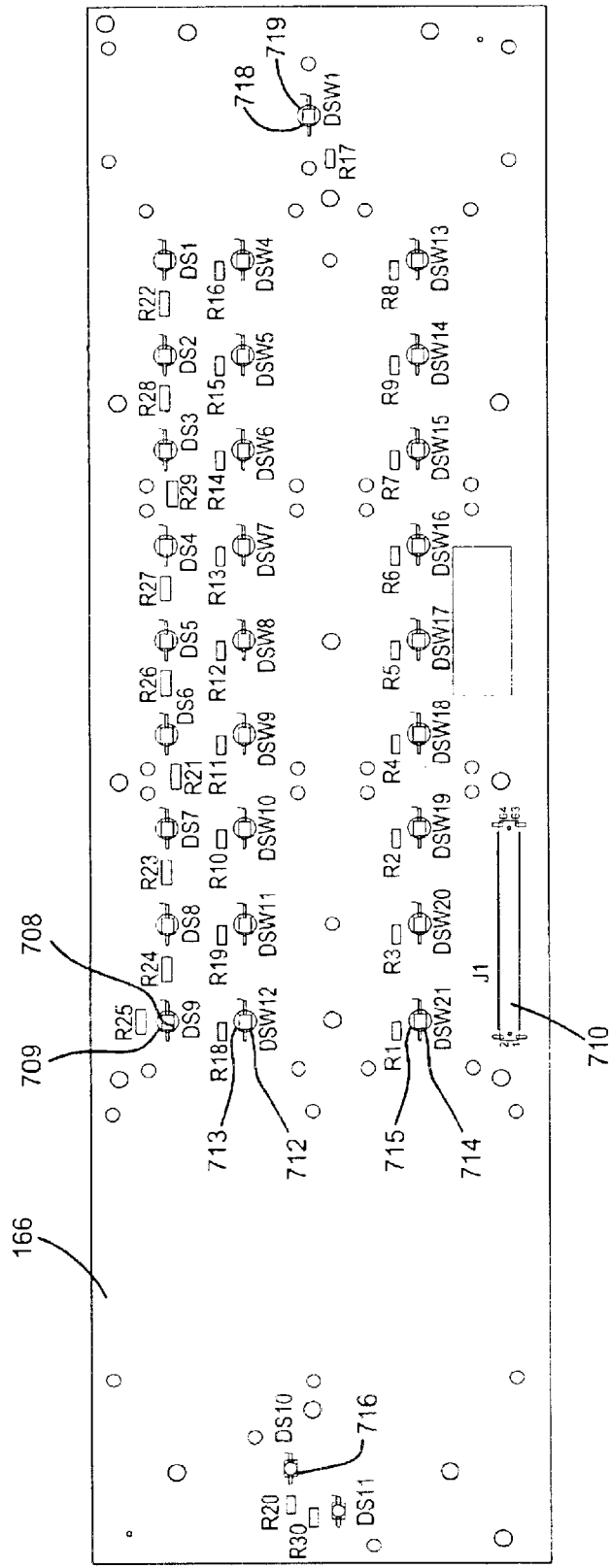
FIG. 25 is a rear view of a front panel printed circuit board of an embodiment of the communication panel.

FIG. 25 shows the rear side of circuit board 166 of the first embodiment. The circuit board 166 includes a row of openings 709 that lies behind each line indicator 168. A light emitting diode (LED) 708 spans the opening 709 and is switched on when the corresponding line is in use. A row of openings 713 lies behind each line button 118. An LED 712 spans the opening 713 and is on in response to a user pressing the line button 118 to cause the line buttons 118 to be constantly lit. A row of openings 715 lies behind each remote headset button 116. An LED 714 spans the opening 715 and is on in response to a user pressing the remote headset buttons 116.

An additional LED 716 is includes for auxiliary lighting purposes, such as lighting a logo indicator. An opening 719 is included behind a button such as the conference button, and an LED 718 spans the opening 719 to cause the conference button to be lit, either constantly or in response to being depressed by the user. The keypad circuit board 166 also includes the connector 710 that mates to the connector 156 of the main circuit board 154 to eliminate ribbon cable connections between the circuit boards.

Figure 26:
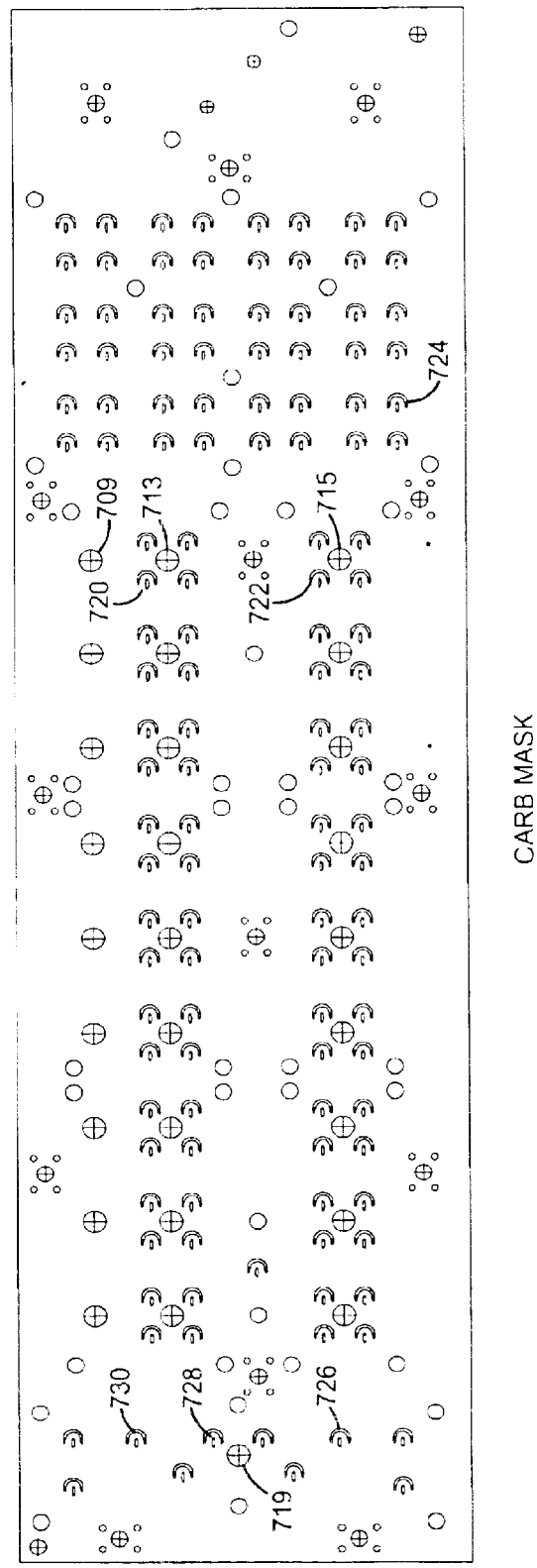
FIG. 26 is a front view of the front panel printed circuit board of FIG. 25.

FIG. 26 shows the front side and carbon contact mask of the keypad circuit board 166. For each line button 118, a set of four carbon pads 720 are included that allows the depressed button to complete a circuit of the main circuit board 154. The pads 720 surround the LED opening 713. Similarly, for each remote headset button 116, a set of four carbon pads 722 allows the depressed button to complete a circuit of the main circuit board 154. The pads 722 surround the LED opening 715.

The dialing buttons 114 include carbon pad sets 724. The on-hook button 124 includes carbon pads 730. The hold button 120 includes carbon pads 726. The conference button 122 includes carbon pads 728 spaced around LED opening 719.

Figure 27:
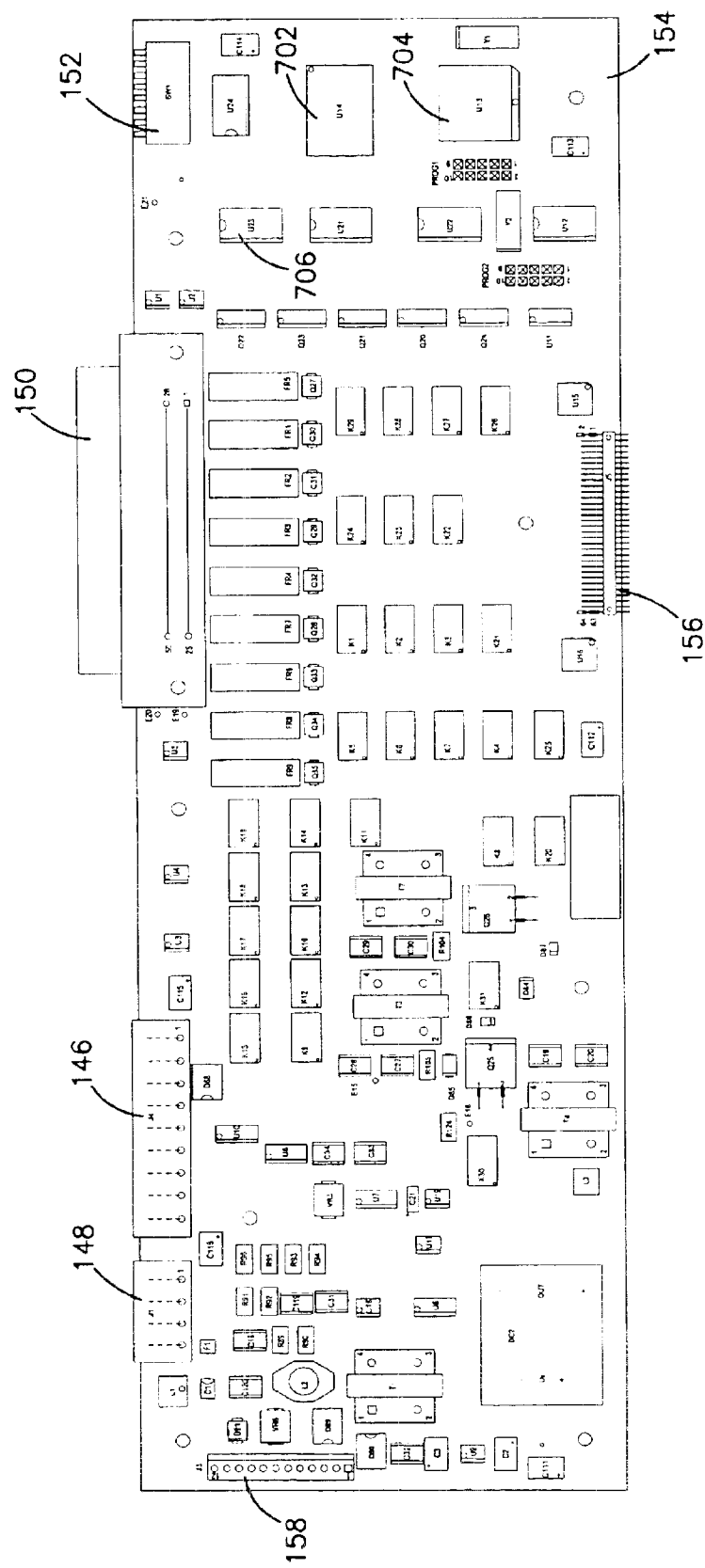
FIG. 27 is a top view of a bottom printed circuit board of an embodiment of the communication panel.

FIG. 27 shows the main circuit board 154 in greater detail. The circuit board includes the headset/power jack connector 158, the power connector 148, ringer/headset connector 146, line connector 150, and multi-switch 152. Additionally, the circuit board includes the connector 156 that mates to the connector 710 of the keypad circuit board 166. The main circuit board 154 contains communication panel circuitry well-known in the art such as tone and pulse generators. The main circuit board 154 utilizes several integrated circuits including but not limited to the integrated circuits 702, 704, and 706.

The integrated circuits (ICs) of the communication panel 100 are protected from electrostatic discharge emanating from the user by including all of the ICs on the main circuit board 154 and by including all button contacts on the keypad circuit board 166. If any static discharge occurs through or around one or more of the buttons of the keypad 170, the discharge is greatly dissipated once it has traveled through the circuit paths of the keypad circuit board 166 and through the connectors 710 and 156.

The circuit board structures of FIGS. 25–27 are equally applicable to the second and third alternative embodiments, as well as others, by modification of the placement of the LEDs, openings, and/or carbon contacts which can be understood by one skilled in the art when referencing the description and figures of the alternative embodiments.

While the invention has been particularly shown and described with reference to preferred embodiments thereof, it will be understood by those skilled in the art that various other changes in the form and details may be made therein without departing from the spirit and scope of the invention.

What is claimed is:

1. A communication panel, comprising:
    a first surface with a plurality of holes;
    a second surface substantially perpendicular to the first surface;
    a first printed circuit board having a first connector;
    a second printed circuit board substantially perpendicular to the first printed circuit board, the second printed circuit board having a second connector mated to the first connector of the first printed circuit board; and
    a cover surface having a rear portion and a top portion perpendicular to the rear portion, the cover surface being mounted to the first and second surfaces such that the rear portion is parallel to and opposite the first surface and the top portion is parallel to and opposite the second surface, and wherein the first and second printed circuit boards are disposed within an interior region defined by the first surface, second surface, and cover surface.

2. The communication panel of claim 1, further comprising:
    an elastomeric keypad disposed between the first printed circuit board and a first side of the first surface, wherein the keypad has a plurality of buttons that protrude through the plurality of holes.

3. The communication panel of claim 2, further comprising a front surface having at least one opening, the front surface abutting a second side of the first surface, wherein one or more of the plurality of buttons of the keypad protrude through the at least one opening.

4. The communication panel of claim 3, wherein the front surface includes an extension opening and the cover surface includes an extension disposed within the extension opening of the front surface.

5. The communication panel of claim 2, wherein the first printed circuit board contains a plurality of light emitting diodes aligned with the plurality of buttons of the keypad.

6. The communication panel of claim 1, wherein the second printed circuit board contains a plurality of integrated circuits.

7. The communication panel of claim 1, further comprising a plurality of inserts fastened to the first surface and to the first printed circuit board.

8. The communication panel of claim 1, further comprising:
    third and fourth surfaces disposed at opposing ends of the first surface that are perpendicular to the first surface; and a first bracket mounted to the third surface and a second bracket mounted to the fourth surface.

9. A communication panel, comprising:
a first surface with a plurality of holes;
a first printed circuit board parallel to the first surface, the first printed circuit board having a first connector;
a first elastomeric keypad positioned between a first side of the first surface and the first printed circuit board, the first elastomeric keypad having a plurality of buttons that protrude through the plurality of holes of the first surface; and
a second printed circuit board substantially perpendicular to the first printed circuit board, the second printed circuit board having a second connector mated to the first connector of the first printed circuit board.

10. The communication panel of claim 9, further comprising:
a second surface perpendicular to the first surface; and
a cover surface having a rear portion and a top portion perpendicular to the rear portion, the cover surface being mounted to the first and second surfaces such that the rear portion is parallel to and opposite the first surface and the top portion is parallel to and opposite the second surface, and wherein the first and second printed circuit boards are disposed within an interior region defined by the first surface, second surface, and cover surface.

11. The communication panel of claim 10, further comprising a front surface having at least one opening, the front surface abutting a second side of the first surface, wherein one or more of the plurality of buttons of the keypad protrude through the at least one opening.

12. The communication panel of claim 11, wherein the front surface includes an extension opening and the cover surface includes an extension disposed within the extension opening of the front surface.

13. The communication panel of claim 9, wherein the first printed circuit board contains a plurality of light emitting diodes aligned with the plurality of buttons of the keypad.

14. The communication panel of claim 9, wherein the second printed circuit board contains a plurality of integrated circuits.

15. The communication panel of claim 9, further comprising a plurality of inserts fastened to the first surface and to the first printed circuit board.

16. The communication panel of claim 10, further comprising:
third and fourth surfaces disposed at opposing ends of the first surface that are perpendicular to the first surface; and
a first bracket mounted to the third surface and a second bracket mounted to the fourth surface.

17. A communication panel, comprising:
a first printed circuit board having a first connector and having a plurality of electrical contacts;
a first elastomeric keypad abutting the first printed circuit board, the elastomeric keypad having a plurality of conductive contact pads aligned with the plurality of electrical contacts of the first printed circuit board; and
a second printed circuit board substantially perpendicular to the first printed circuit board, the second printed circuit board having a second connector mated to the first connector of the first printed circuit board, the second printed circuit board being in electrical communication with the plurality of contacts of the first printed circuit board through the mated first and second connectors.

18. The communication panel of claim 17, further comprising:
a first surface with a plurality of holes;
a second surface perpendicular to the first surface; and
a cover surface having a rear portion and a top portion perpendicular to the rear portion, the cover surface being mounted to the first and second surfaces such that the rear portion is parallel to and opposite the first surface and the top portion is parallel to and opposite the second surface, and wherein the first and second printed circuit boards are disposed within an interior region defined by the first surface, second surface, and cover surface.

19. The communication panel of claim 18, further comprising a front surface having at least one opening, the front surface abutting the first surface, wherein one or more of the plurality of buttons of the keypad protrude through the at least one opening.

20. The communication panel of claim 19, wherein the front surface includes an extension opening and the cover surface includes an extension disposed within the extension opening of the front surface.

21. The communication panel of claim 17, wherein the first printed circuit board contains a plurality of light emitting diodes aligned with the plurality of buttons of the keypad.

22. The communication panel of claim 17, wherein the second printed circuit board contains a plurality of integrated circuits.

23. The communication panel of claim 18, further comprising a plurality of inserts fastened to the first surface and to the first printed circuit board.

24. The communication panel of claim 18, further comprising:
third and fourth surfaces disposed at opposing ends of the first surface that are perpendicular to the first surface; and
a first bracket mounted to the third surface and a second bracket mounted to the fourth surface.

25. A communication panel, comprising:
a first surface having a plurality of holes;
a first printed circuit board parallel to the first surface and having a first connector;
a second printed circuit board substantially perpendicular to the first printed circuit board, the second printed circuit board having a second connector mated to the first connector of the first printed circuit board;
a first silicone rubber keypad positioned between a first side of the first surface and the first printed circuit board, a first silicone rubber keypad having a plurality of buttons that protrude through the plurality of holes of the first surface; and
a front surface having at least one opening, the front surface abutting a second side of the first surface, wherein one or more of the plurality of buttons of the keypad protrude through the at least one opening a second surface perpendicular to the first surface;
a cover surface having a rear portion and a top portion perpendicular to the rear portion, the cover surface being mounted to the first and second surfaces such that the rear portion is parallel to and opposite the first surface and the top portion is parallel to and opposite the second surface, and wherein the first and second printed circuit boards are disposed within an interior region defined by the first surface, second surface, and cover surface;
wherein the front surface includes an extension opening and the cover surface includes an extension disposed within the extension opening of the front surface.

26. The communication panel of claim 25, wherein the first printed circuit board contains a plurality of light emitting diodes aligned with the plurality of buttons of the keypad.

27. The communication panel of claim 25, wherein the second printed circuit board contains a plurality of integrated circuits.

28. The communication panel of claim 25, further comprising a plurality of inserts fastened to the first surface and to the first printed circuit board.

29. The communication panel of claim 25, further comprising:
  third and fourth surfaces disposed at opposing ends of the first surface that are perpendicular to the first surface; and
  a first bracket mounted to the third surface and a second bracket mounted to the fourth surface.

* * * * *

UNITED STATES PATENT AND TRADEMARK OFFICE
CERTIFICATE OF CORRECTION

PATENT NO. : 6,850,416 B2
DATED : February 1, 2005
INVENTOR(S) : Madsen et al.

It is certified that error appears in the above-identified patent and that said Letters Patent is hereby corrected as shown below:

<u>Column 14,</u>
Line 48, "board, a first silicone" should read -- board, the first silicone --
Line 55, "at least one opening" should read -- at least one opening; --
Lines 55-56, "a second surface perpendicular" should start a new paragraph Signed and Sealed this Seventh Day of June, 2005

JON W. DUDAS
*Director of the United States Patent and Trademark Office*